(12) United States Patent
Ciocchini et al.

(10) Patent No.: US 11,557,369 B2
(45) Date of Patent: Jan. 17, 2023

(54) SYSTEMS AND METHODS TO REDUCE THE IMPACT OF SHORT BITS IN PHASE CHANGE MEMORY ARRAYS

(71) Applicant: Micron Technology, Inc., Boise, ID (US)

(72) Inventors: Nicola Ciocchini, Boise, ID (US); Peng Zhao, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 17/221,108

(22) Filed: Apr. 2, 2021

(65) Prior Publication Data

US 2022/0319629 A1 Oct. 6, 2022

(51) Int. Cl.
*G11C 29/00* (2006.01)
*G11C 29/50* (2006.01)
*G11C 13/00* (2006.01)

(52) U.S. Cl.
CPC ...... *G11C 29/50004* (2013.01); *G11C 13/003* (2013.01); *G11C 13/0004* (2013.01); *G11C 13/0069* (2013.01); *G11C 2029/5004* (2013.01)

(58) Field of Classification Search
CPC .......... G11C 29/50004; G11C 13/0004; G11C 13/003; G11C 13/0069
USPC .......................................................... 365/200
See application file for complete search history.

(56) References Cited

U.S. PATENT DOCUMENTS 6,496,417 B1 * 12/2002 Shiau ................. G11C 16/3445
365/185.18
10,942,799 B1 * 3/2021 Khakifirooz ........... G11C 16/14

\* cited by examiner

*Primary Examiner* — Vu A Le
(74) *Attorney, Agent, or Firm* — Fletcher Yoder, P.C.

(57) ABSTRACT

A memory device includes a memory array comprising a plurality of memory elements and a memory controller coupled to the memory array. The memory controller when in operation receives an indication of a defect in the memory array determines a first location of the defect when the defect is affecting only one memory element of the plurality of memory elements, determines a second location of the defect when the defect is affecting two or more memory elements of the plurality of memory elements, and performs a blown operation on a defective memory element at the second location when the defect is affecting two or more memory elements of the plurality of memory elements.

22 Claims, 6 Drawing Sheets

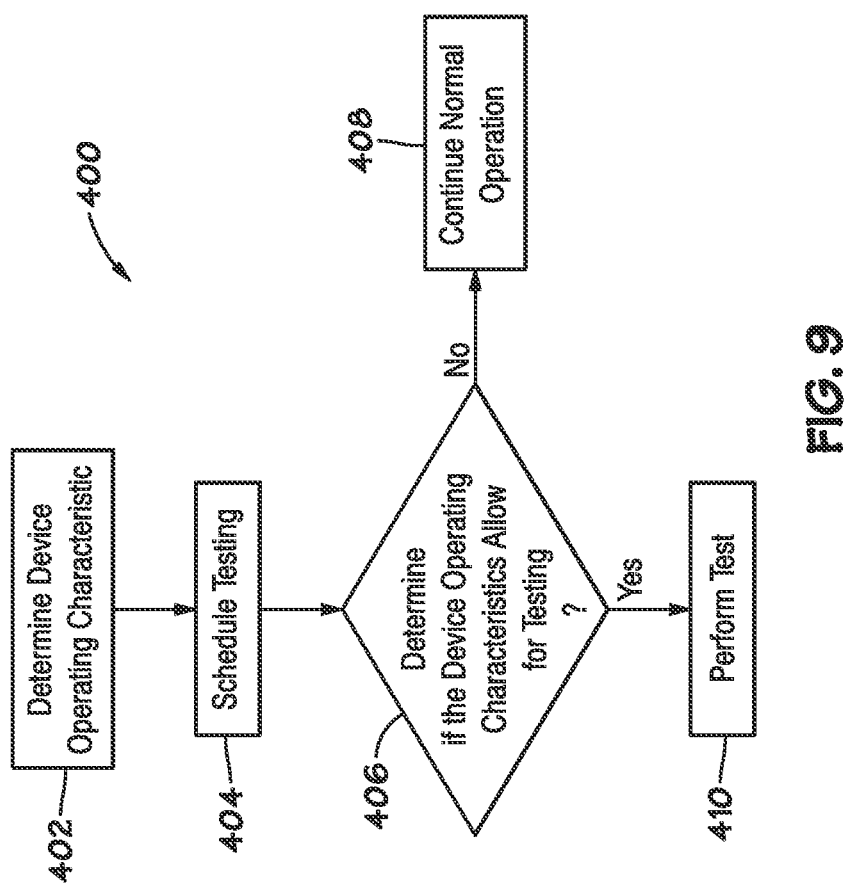

SYSTEMS AND METHODS TO REDUCE THE IMPACT OF SHORT BITS IN PHASE CHANGE MEMORY ARRAYS

BACKGROUND

Field of the Present Disclosure

Embodiments of the present disclosure relate generally to the field of semiconductor devices. More specifically, embodiments of the present disclosure relate to reducing the impact of short bits in a memory array, for example, in a Phase Change Memory array.

Description of Related Art

A semiconductor memory device, such as a dynamic random-access memory (DRAM), may store data as bits in memory cells that are implemented using capacitors and transistors. For example, the charge state (e.g., charged or discharged) of a capacitor may determine whether a memory cell stores "1" or "0" as a binary value. Large numbers of memory cells may be packed into the semiconductor memory device, along with additional logic that, for example, enables reading data to, writing data from, and refreshing data in, the memory cells.

Memory device technologies have continued to evolve. For example, it may be beneficial to have non-volatile memory in a memory device. One type of non-volatile memory that has been developed is phase change memory (PCM) that operates to store a "1" or "0" based upon a state or phase (crystalline and amorphous) of the PCM. Memory cells of the PCM (or DRAM) can be arranged into three dimensional arrays that are implemented into interconnected memory cell array stacks.

These memory devices have been implemented into commercial products in multiple industries and carry out various different tasks. However, defects in memory arrays arise from repeated daily usage and unusual deficiencies in manufacturing. As three dimensional memory arrays continues to grow in implementation, techniques to reduce the impact of defects in the memory arrays are desirable.

BRIEF DESCRIPTION OF DRAWINGS

FIG. 9 is a flowchart illustrating an example for the process of FIG. 6, in accordance with the present disclosure.

DETAILED DESCRIPTION

Figure 1:
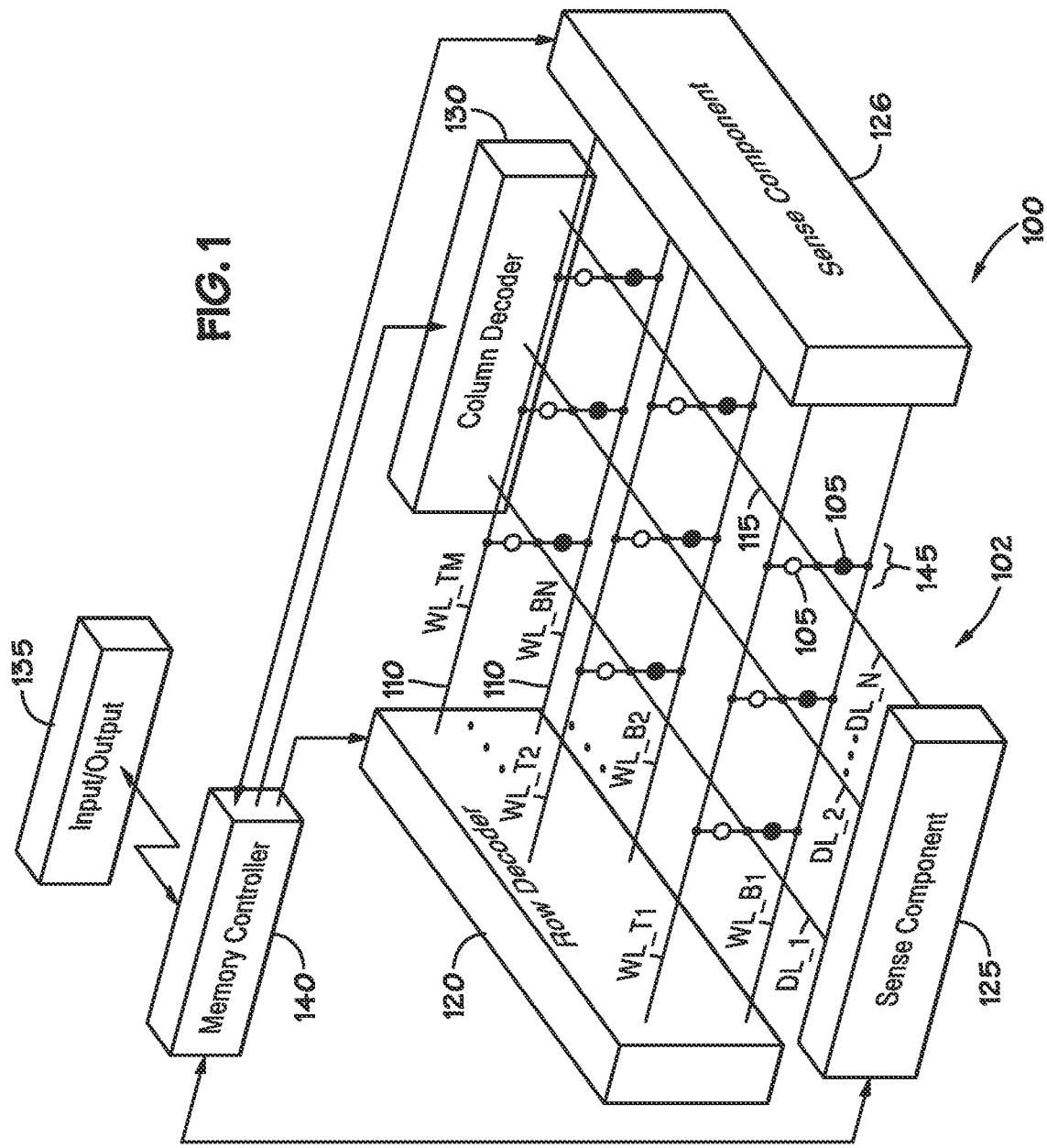
FIG. 1 is an example of a memory device including memory cells, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may perform storage using electronic memory cells, such as capacitors, flip-flops, latches and/or inverter loops, among others. Examples of memory devices include random access memory (RAM) devices, dynamic RAM (DRAM) devices, static RAM (SRAM) devices, flash memories, and/or phase change memory (PCM) devices.

With respect to the electronic memory cells, the memory cells are implemented in memory arrays that are interconnected. This allows for efficient data access and routing throughout interconnected memory array stacks. However, there may arise defects within memory arrays (e.g., shorts, open bit) that affect the memory array. For example, an open bit will affect a single memory cell (e.g., bit) within the array and cause a single bit location failure. In another example, a short bit will cause a failure that will propagate and affect multiple bits (i.e. bits in the same row and/or column of the single bit location failure), which can affect multiple memory cells and disrupt entire memory array stacks. One technique for the detection of defects in memory arrays includes detecting shorts with a probe by testing the entire memory array structure. If the short can be repaired, it will be repaired. However, when these shorts cannot be detected during probe testing and/or when repair is not possible, the entire memory array is discarded and considered a loss. Accordingly, additional techniques for the detection of defects in memory arrays are described herein.

In one embodiment, a sensing amplification circuit is located on a wordline side and/or on a bitline side of the memory array. The sensing amplification circuit on the wordline and bitline sides may be utilizing in some embodiments to allow for detection and identification of a single wordline fail (SWL) and single bitline fail (SBL), respectively. The identification of the SWL and SBL may allow for the identification of the single bit fail (SBF), where the bit failure (e.g. due to short or open) is located.

In other embodiments, the SBF may be identified as the bit defect based upon the sensing amplification circuit on the wordline and bitline side detecting if an entire wordline (or more than one location on the wordline) and/or an entire bitline (or more than one location on the bitline) has failed.

Depending of the type of the bit failure, certain actions may be taken to lessen the impact of the bit failure of the memory array stacks.

FIG. 1 illustrates an example memory device 100 (or system) in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, and may not be representative of their actual physical positions within the memory device 100. In the illustrative example of FIG. 1, the memory device 100 includes a memory array 102, such as a 3D memory array. The memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states. A memory cell 105 may, in some embodiments, be a PCM cell (e.g., a 3D XPoint memory cell). Furthermore, although some elements included in FIG. 1 are labeled with a numeric indicator, other corresponding elements are not labeled, though they are the same or would be understood to be similar, in an effort to increase visibility and clarity of the depicted features.

The memory array 102 may include two or more two-dimensional (2D) memory arrays formed adjacent one another (e.g., on top of or next to one another). This may increase a number of memory cells 105 that may be placed or created on a single die or substrate as compared with 2D arrays, which in turn may reduce production costs, or increase the performance of the memory device, or both. Based on the example depicted in FIG. 1, the memory array 102 includes two levels of memory cells 105; however, the number of levels may not be limited to two and may, for example, include a greater number of levels. Each level may be aligned or positioned such that memory cells 105 may be aligned (exactly, overlapping, or approximately) with one another across each level, forming a memory cell array stacks 145. In some cases, the memory cell array stacks 145 may include two PCM cells (e.g., two 3D XPoint memory cells) with one disposed above the other another.

In some embodiments, each row of memory cells 105 is connected to a word line (e.g., a word line 110), and each column of memory cells 105 is connected to a bit line 115. Word lines 110 and bit lines 115 may be substantially perpendicular to one another and may create an array of memory cells. As shown in FIG. 1, the two memory cells 105 in a memory cell array stacks 145 may share a common conductive line such as a bit line 115. That is, a bit line 115 may be in electronic communication with the bottom electrode of the upper memory cell 105 and the top electrode of the lower memory cell 105. In other embodiments, each of the memory cell 105 (e.g., the upper memory cell, the lower memory cell) may be configured with its own bit line. In such cases, the memory cells may be separated by an insulation layer. Other configurations are envisioned, for example, a third layer may share a word line 110 with a lower layer. In general, one memory cell 105 may be located at the intersection of two conductive lines such as a word line 110 and a bit line 115. This intersection may be referred to as an address of the memory cell 105. A target memory cell may be a memory cell 105 located at the intersection of an energized word line 110 and bit line 115; that is, word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells.

Figure 2:
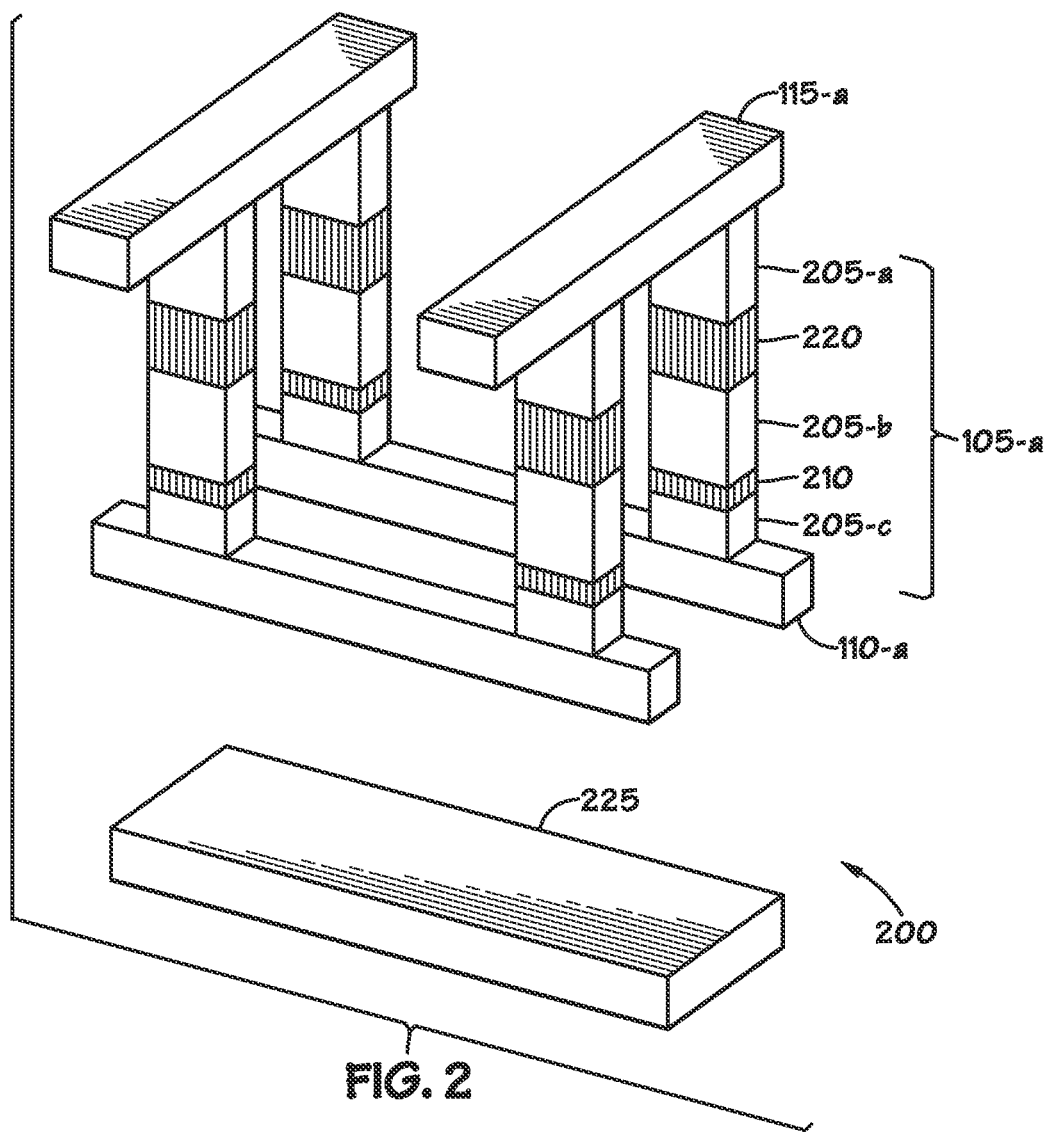
FIG. 2 is an example of a memory portion of the memory device of FIG. 1 including memory cells in accordance with an embodiment of the present disclosure.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some embodiments, a memory cell 105 may include a chalcogenide alloy positioned between a first electrode and a second electrode. One side of the first electrode may be coupled to a word line 110 and the other side of the first electrode to the chalcogenide alloy. In addition, one side of the second electrode may be coupled to a bit line 115 and the other side of the second electrode to the chalcogenide alloy. The first electrode and the second electrode may be the same material (e.g., carbon) or different materials. In other embodiments, the memory cell 105 may include an additional electrode to separate the chalcogenide alloy into two parts, as depicted in FIG. 2. A first part of the chalcogenide alloy may have a different composition than a second part of the chalcogenide alloy. In some embodiments, the first part of the chalcogenide alloy may have a different function than the second part of the chalcogenide alloy. The additional electrode may be the same material (e.g., carbon) or different than the first electrode and/or the second electrode.

Return to FIG. 1, operations such as reading and writing may be performed on memory cells 105 by energizing or selecting a word line 110 and a bit line 115. In some embodiments, word lines 110 may also be known as access lines and bit lines 115 may also be known as digit lines. References to word lines and bit lines, or their analogues, are interchangeable without loss of understanding or operation. Energizing or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a memory cell 105 (e.g., a capacitor, a resistor, or the resistance of the chalcogenide material(s) in the storage portion of the memory cell 105) may be electrically isolated from the bit line 115 by a selection component. The word line 110 may be connected to and may control the selection component. For example, the selection component may be a transistor and the word line 110 may be connected to the gate of the transistor. Energizing the word line 110 results in an electrical connection or closed circuit between the logic storing device of a memory cell 105 and its corresponding bit line 115. The bit line 115 may then be accessed to either read or write the memory cell 105. Upon selecting a memory cell 105, the resulting signal may be used to determine the stored logic state. In some cases, a first logic state may correspond to no current or a negligibly small current, whereas a second logic state may correspond to a finite amount of current. In some cases, a memory cell 105 may include a 3D XPoint memory cell or a self-selecting memory (SSM) cell, both having two terminals and may not need a separate selection component. As such, one terminal of the 3D XPoint memory cell or the SSM cell may be electrically connected to a word line 110 and the other terminal of the 3D XPoint memory cell or the SSM cell may be electrically connected to a bit line 115.

Accessing memory cells 105 may be controlled through a row decoder 120 and a column decoder 130. For example, a row decoder 120 may receive a row address from the memory controller 140 and energize the appropriate word line 110 based on the received row address. Similarly, a column decoder 130 may receive a column address from the memory controller 140 and energize the appropriate bit line 115. For example, the memory array 102 may include multiple word lines 110, labeled WL_B1 (or WL_T1) through WL_BM (or WL_TM), and multiple bit lines 115, labeled DL_1 through DL_N, where M and N depend on the array size. Thus, by energizing a word line 110 and a bit line 115, e.g., WL_B2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected (e.g., a memory cell 105 turns on, switches on, conducts current, or becomes activated). In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

Sense component 125 may include various transistors or amplifiers in order to detect and amplify a difference in the signals, which may be referred to as latching. The detected logic state of memory cell 105 may then be output through column decoder 130. In some cases, the sense component 125 may be part of a column decoder 130. Or, the sense component 125 may be connected to or in electronic communication with the column decoder 130. FIG. 1 also illustrates an additional and optional sense component 126. In some embodiments, sense component 126 may be utilized in place of sense component 125 (i.e. only one of sense component 125 and sense component 126 is present in the memory device 100). Sense component 126, as illustrated, is coupled to the word lines 110 and for example, operates in conjunction with the row decoder 120. For example, the sense component 126 may operate in conjunction with the row decoder 120 a manner similar to the sense component 125 as described above. In some cases, sense component 126 may be part of a column decoder 130.

Alternatively, sense component 126 may be connected to or in electronic communication with column decoder 130.

As briefly outlined above, a memory cell 105 may be set or written by similarly energizing the relevant word line 110 and bit line 115 and at least one logic value may be stored in the memory cell 105. The column decoder 130 and/or the row decoder 120 may accept data, for example input/output 135, to be written to one or more memory cells 105. In some memory architectures, accessing the memory cell 105 may degrade or destroy the stored logic state and re-write or refresh operations may be performed to return the original logic state to memory cell 105. In DRAM, for example, the capacitor of a memory cell 105 may be partially or completely discharged during a sense operation, corrupting the stored logic state. So, the logic state may be re-written after a sense operation. Additionally, energizing a single word line 110 may result in the discharge of all memory cells 105 in the row; thus, several or all memory cells 105 in the row may need to be re-written. However, in other non-volatile memory, such as SSM, PCM (e.g., 3D) (Point memory), FeRAM, or 3D NAND memory, accessing the memory cell 105 may not destroy the logic state and, thus, the memory cell 105 may not require re-writing after accessing.

In operation, the memory controller 140 may control the operation (e.g., read, write, re-write, refresh, discharge) of memory cells 105 through the various components, for example, row decoder 120, column decoder 130, sense component 125, and/or sense component 126. In some cases, one or more of the row decoder 120, column decoder 130, sense component 125, and/or sense component 126 may be co-located with the memory controller 140. The memory controller 140 may generate row and column address signals in order to energize the desired word line 110 and bit line 115. The memory controller 140 may also generate and control various voltages or currents used during the operation of memory device 100.

The memory controller 140 may receive user data through the input/output 135, which may be a physical connection or a path coupled to a connector of the memory device 100. In some embodiments, the memory controller 140 may read a previous user data from the memory cells and write a new user data and merge the new user data with the previous user data into write registers. Thereafter, mask register (MR) information may be generated, wherein the mask register information may indicate bits of the previous user data stored in the memory cells to be switched or not to be switched in their logic values. In some embodiments, the memory controller 140 may count numbers of a first logic value (logic "0") and a second logic value (logic "1") to be written using the MR information, respectively, and store the numbers of the first logic value and the second logic value into a first counter and a second counter, respectively. In some embodiments, the memory controller 140 may apply a programming pulse to the memory cells 105 according to the mask register information.

In general, the amplitude, shape, polarity, and/or duration of an applied voltage or current discussed herein may be adjusted or varied and may be different for the various operations discussed in operating the memory device 100. For example, during an access operation, such as a reset operation, a set operation and/or a read operation, a current and/or a voltage may be adaptively controlled. Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

FIG. 2 illustrates an example of a memory portion 200 of the memory array 102 that supports selective current mirror control in accordance with embodiments of the present disclosure. The memory portion 200 may be an example of portions of memory array 102 described with reference to FIG. 1. As depicted in FIG. 2, the memory portion 200 includes multiple materials to construct a memory cell 105-a. Each memory cell 105-a is stacked in a vertical direction (e.g., perpendicular to a substrate) to create memory cell array stacks (e.g., the memory cell array stacks 145). The memory cell 105-a may be an example of a memory cell 105 described with reference to FIG. 1. Although some elements included in FIG. 2 are labeled with a numeric indicator, other corresponding elements are not labeled, though they are the same or would be understood to be similar, in an effort to increase visibility and clarity of the depicted features.

The memory portion 200 also includes word lines 110-a and bit lines 115-a, which may be examples of word line 110 and bit line 115 described with reference to FIG. 1. Illustration of the materials between the word lines 110-a and the bit lines 115-a depicted in FIG. 2 may represent a lower portion of the memory cell 105 in FIG. 1. Memory portion 200 includes electrodes 205, logic storage elements 210, selector device elements 220, and a substrate 225. In some examples, a single component including a chalcogenide alloy (not shown, replacing selector device element 220, logic storage element 210, and electrode 205-b) may act as both a logic storage element and a selector device. Electrode 205-a may be in electronic communication with bit line 115-a and electrode 205-c may be in electronic communication with word line 110-a.

In some cases, memory portion 200 may include an array of memory cell array stacks, and each memory cell array stack may include multiple memory cells 105-a. Memory portion 200 may be made by forming a stack of conductive materials, such as word lines 110-a, in which each conductive material is separated from an adjacent conductive material by electrically insulating materials in between. The electrically insulating materials may include oxide or nitride materials, such as silicon oxide, silicon nitride, or other electrically insulating materials. These materials may be formed above the substrate 225, such as a silicon wafer, or any other semiconductor or oxide substrate. Subsequently, various process steps may be utilized to form the materials in between the word lines 110-a and bit lines 115-a such that each memory cell 105-a may be coupled with a word line 110-a and a bit line 115-a.

The selector device element 220 may be connected with the logic storage element 210 through electrode 205-b. In some examples, the positioning of the selector device element 220 and the logic storage element 210 may be flipped. The composite stack including the selector device element 220, the electrode 205-b, and the logic storage element 210 may be connected to a word line 110-a through the electrode 205-c and to a bit line 115-b through the electrode 205-a. The selector device element 220 may aid in selecting a particular memory cell 105-a or may help prevent stray currents from flowing through non-selected memory cells 105-a adjacent to a selected memory cell 105-a. The selector device element 220 may include an electrically non-linear component (e.g., a non-Ohmic component) such as a metal-insulator-metal (MIM) junction, an Ovonic threshold switch (OTS), or a metal-semiconductor-metal (MSM) switch, among other types of two-terminal selector device such as a diode. In some cases, the selector device element includes a chalcogenide alloy. The selector device, in some examples, include an alloy of selenium (Se), arsenic (As), silicon (Si), and germanium (Ge).

As discussed above, memory cells 105-a of FIG. 2 may include a material with a variable resistance. Variable resistance materials may refer to various material systems, including, for example, metal oxides, chalcogenides, and the like. Chalcogenide materials are materials or alloys that include at least one of the elements sulfur (S), tellurium (Te), or selenium (Se). Many chalcogenide alloys may be possible—for example, a germanium-antimony-tellurium alloy (Ge—Sb—Te) is a chalcogenide material. Other chalcogenide alloys not expressly recited here may also be employed.

To set a low-resistance state, a memory cell 105-a may be heated by passing a current through the memory cell 105-a. Heating caused by electrical current flowing through a material that has a finite resistance may be referred to as Joule or Ohmic heating. Joule heating may thus be related to the electrical resistance of the electrodes or the phase change material. Heating the phase change material to an elevated temperature (but below its melting temperature) may result in the phase change material crystallizing and forming the low-resistance state. In some cases, a memory cell 105-a may be heated by means other than Joule heating, for example, by using a laser. To set a high-resistance state, the phase change material may be heated above its melting temperature, for example, by Joule heating. The amorphous structure of the molten material may be quenched, or locked in, by abruptly removing the applied current to quickly cool the phase change material.

Figure 3:
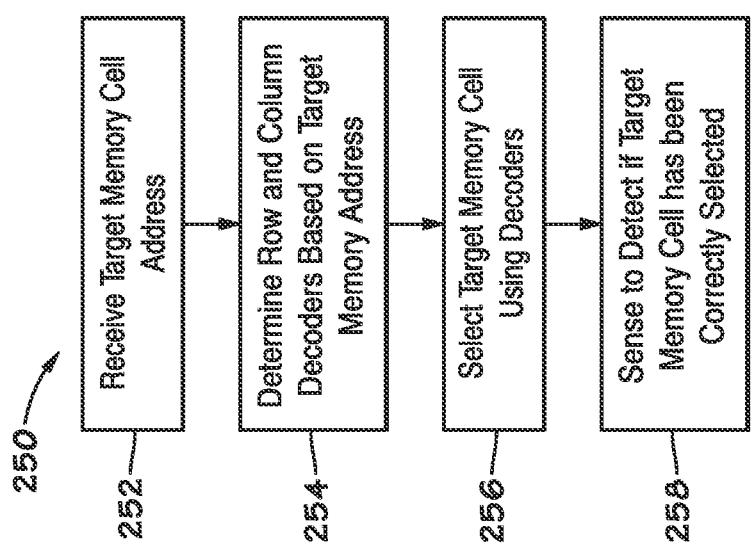
FIG. 3 is a flowchart of a process for selecting a memory cell from the memory portion of FIG. 2, in accordance with an embodiment of the present disclosure.

FIG. 3 is a flowchart of a method 250 for selecting a target memory cell from a set of memory cells 105. The memory controller 140 is described below as performing the method 250, but it should be understood that any suitable processing circuit may additionally or alternatively perform the method 250. Furthermore, although the method 250 is described below as being performed in a particular order, it should be understood one or more of the steps of the method 250 may, for example, be omitted or reordered.

At block 252, the memory controller 140 may receive an address that targets the memory cell 105. The address may be a logical address that is converted by the memory controller 140 into a physical address. The memory controller 140 may use the physical address to make certain control decisions. For example, at block 254, the memory controller 140 may use the physical address to determine which row decoders 120 and column decoders 130 to use to select the memory cell 105.

In conjunction with block 254, the memory controller 140 may look-up an indication of the row decoders 120 and column decoders 130 in a memory, such as through use of a query of a database, and/or perform address arithmetic, to determine which row decoders 120 and column decoders 130 corresponds to the physical address of the memory cell 105 (e.g., is located closest to the physical address of the memory call). The database may have been populated at a time of manufacturing of the memory device 100 and/or adjusted during operation of the memory device 100 to reflect any logical-to-physical address assignments.

At block 256, the memory controller 140 may use the row decoders 120 and column decoders 130 to transmit a selection current to a target memory cell of the memory cells 105. The memory controller 140 may leverage physical distances between the memory cells 105 and the row decoders 120 and column decoders 130 to minimize an impact that activation of the row decoders 120 and column decoders 130 initially has on the memory cells (e.g., to reduce current spikes). Furthermore, each of the memory cells 105 may correspond to two column decoders 130 for its corresponding of the bit lines 115 and two row decoders 120 for its corresponding of the word lines 110. The memory controller 140 may leverage factors discussed above to determine which of the two decoders for the bit lines 115 and the word lines 110 may be activated.

At block 258, the memory controller 140 may employ sense component 125 and/or sense component 126 to determine if the target memory cell 105 has been selected correctly by row decoders 120 and column decoders 130. In some embodiments, the sense components 125 and 126 are coupled directly to the bit lines 115 and word lines 110, respectively, to ensure correct sensing of the selection current being transmitted to the target memory cell.

As illustrated above in FIG. 3, normal operation of the memory array 102 consists of selecting the target memory cells with decoders 120 and 130. However, defects in memory arrays 102 may arise and prevent the selection of the target memory cells.

Figure 4:
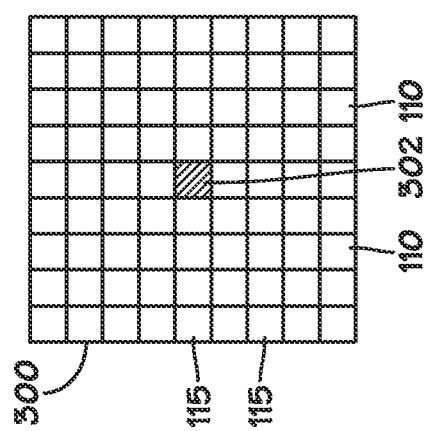
FIG. 4 a diagram illustrating a first type of defect present within the memory portion of FIG. 2, in accordance with an embodiment of the present disclosure.

With the foregoing in mind, FIG. 4 illustrates a graphical illustration 300 of the memory array 102. A first type of defect that may arise within the memory array 102 is illustrated in the graphical illustration 300 of the memory array 102. The memory array 102 is experiencing an open bit defect at bit 302. The open bit defect may correspond to a relatively high threshold voltage ($V_t$) response (e.g., a $V_t$ response above a predetermined value) when the bit 302 is selected. The open bit defect may only affect the bit 302 and not the rest of the memory array 102. As such, the open bit defect may cause as a single bit fail in the memory array 102, whereby the single bit fail may cause the bit 302 to cease functionality.

In some embodiments, the open bit fail may be caused by a loss of material that encapsulates the bit 302. The encapsulation may break due to repeated cycling of the bit over time. In other embodiments, the open bit may be caused by a disconnected component that disconnects the bit 302. The operation and usage of the memory array 102 may continue to operate without the bit 302 and it may be observed that no noticeable impact on overall processing and function occur when the open bit defect causes the single bit fail at bit 302 (e.g. the failed bit 302 can be isolated and skipped whereas the remaining portions of the memory array 102 are usable).

Figure 5:
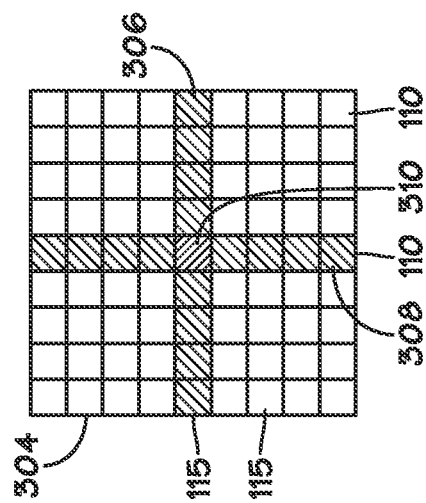
FIG. 5 is a diagram illustrating a second type of defect present within the memory portion of FIG. 2, in accordance with an embodiment of the present disclosure.

FIG. 5 illustrates a graphical illustration 304 of memory array 102. A second type of defect that may arise within the memory array 102 is illustrated in the graphical illustration 304. The memory array 102 is experiencing a short bit defect at bit 310. The short bit defect may affect all of the bits 308 sharing a (common) wordline 110 with bit 310 and/or all of the bits 306 sharing a (common) bit line 315 with bit 310. In some embodiments, the short bit defect may also propagate across multiple memory array decks in the memory array 102. The short bit defect has a failure rate multiplication factor of ~$10^3$ to ~$10^4$, as compared to the failure rate multiplication factor of 1 in a single bit fail. The short bit defect may correspond to a relatively low threshold voltage ($V_t$) response (e.g., a $V_t$ response below a predetermined value) when bit 310 is selected. The short bit defect drains current and saturates drivers of the bits 306 and/or bits 308 such that the bias level for selection is not reached.

The short bit defect may be caused by migration of highly conductive material within the memory array 102. The highly conductive material may come in contact with other metals and cause the short bit defect to occur. The operation and usage of the memory array 102 may be impacted and a noticeable impact on the overall processing and the function occur when the short bit defect causes multiple line fails. Accordingly, while an open bit defect can easily be mapped around, the larger number of bit failures due to the short bit defect impacts the viability of the memory array 102.

In some embodiments, particularly with respect to phase change memory array testing, short bit defects are detected at the probing testing stage during structural tests and repaired if possible. When the repair is not possible, an affected phase change memory array will be discarded during the assembly of a device that would have utilized the affected phase change memory array. However, this technique may not address short bit defects generated during normal customer operation (i.e., subsequent to assembly).

Figure 6:
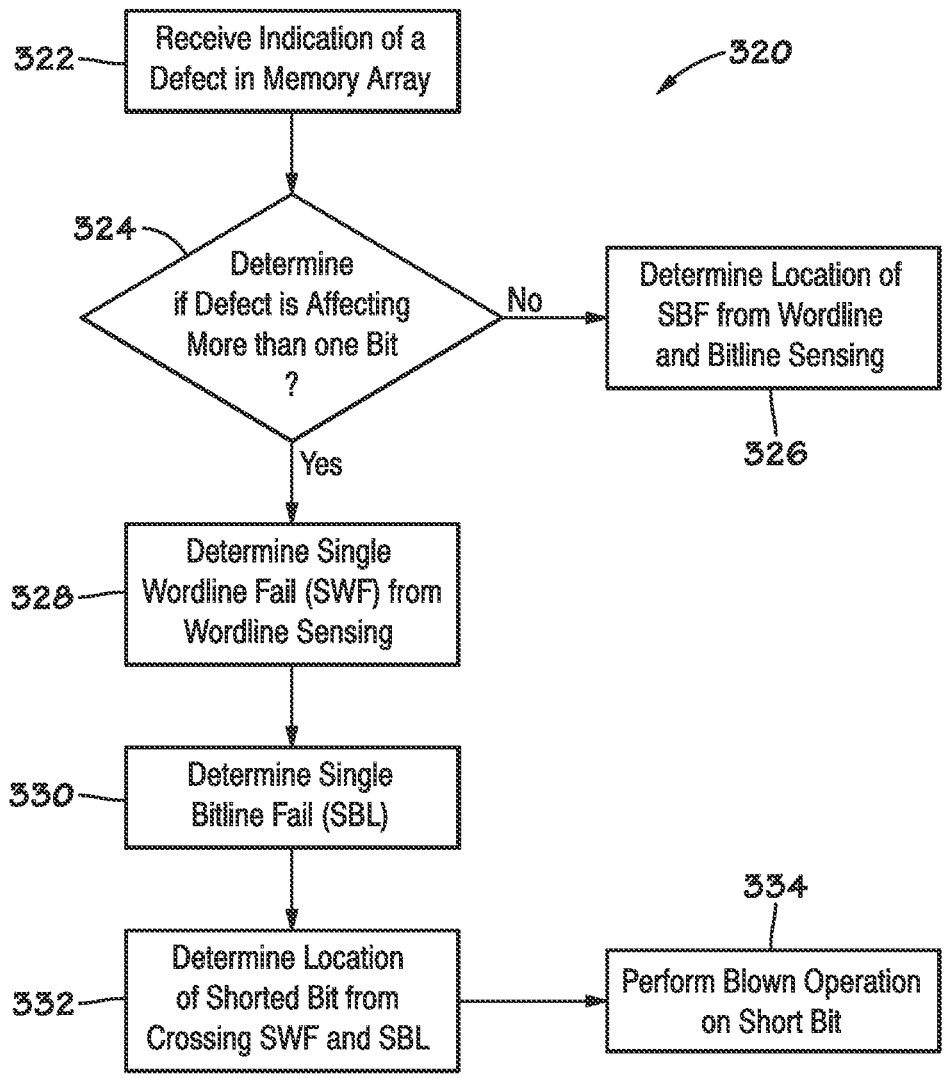
FIG. 6 is a flowchart of a process to determine and alter a type of defect present within the memory portion of FIG. 2, in accordance with an embodiment of the present disclosure.

FIG. 6 is a flowchart of a method 320 for determining and performing actions based upon if the single bit fail is an open bit defect or a short bit defect. The memory controller 140 is described below as performing the method 320, but it should be understood that any suitable processing circuit may additionally or alternatively perform the method 320. Furthermore, although the method 320 is described below as being performed in a particular order, it should be understood one or more of the steps of the method 320 may, for example, be omitted or reordered.

At block 322, the memory controller 140 may receive an indication of a defect (e.g. a faulty memory cell 105) in the memory array 102. In certain embodiments, the sense component 125 may detect the defect in the memory array 102. The sense component 125 may provide the indication to the memory controller 140. In other embodiments, the memory controller 140 may directly detect the defect in the memory array 102. The defect may be detected when changes in current and/or threshold voltage are detected. In other embodiments, a failure to access an affected bit may be detected by the memory controller 140.

In some embodiments, the sensing component 125 may provide voltage and current measurements to the memory controller 140 along with the indication of the defect. As discussed earlier, the open bit defect may be represented by the presence of the high threshold voltage (e.g., a $V_t$ response above a predetermined value) of the bit (e.g. memory cell 105) and the short bit defect may be represented by the presence of the low threshold voltage (e.g., a $V_t$ response below a predetermined value) of the bit (e.g. memory cell 105). As such, the sensing component 125 may detect these changes in the threshold voltage and generate the indication of the defect.

At block 324, the memory controller 140 may determine if the defect is affecting more than one bit. In some embodiments, the memory controller 140 may detect that one bit is affected by the defect and determine that the defect is the open bit fail. That is, the memory controller 140 may attempt to access the bit where the defect is detected to be to determine if the single bit fail is the open bit fail. In other embodiments, the sensing component 125 may determine that the defect is the open bit fail by sensing the single bit fail and determining that bits 306 sharing a bitline 115 with the defective bit and/or bits 308 sharing a wordline 110 with the defective bit.

In certain embodiments, the memory controller 140 may detect that more than one bit is affected by the defect and determine that the defect is the short bit fail. That is, the memory controller 140 may determine that bits 306 sharing a bitline 115 with the defective bit and/or bits 308 sharing a wordline 110 with the defective bit are affected by the defect. In other embodiments, the memory controller 140 may determine that other memory portions of the memory device 100 are affected by the defect and determine that the defect is a short bit fail.

In other embodiments, the memory controller 140 may utilize the sensing component 125 detection of the threshold voltages of the defective bit. The memory controller 140 may compare the values of the threshold voltages to a look-up table with pre-determined values for normal operation, short bit defects, and/or open bit defects. In other embodiments, the memory controller 140 may dynamically alter the look-up table as the device containing the memory array 102 ages over time to reflect the altered threshold voltages due to sustained normal operation and/or defects.

At block 326, the memory controller 140 may determine the location of the single bit fail when the defect is determined to be the open bit fail. The memory controller 140 may employ sensing component 125 and/or sensing component 126 to perform bit line and word line sensing. In some embodiments, the memory controller 140 may utilize the row decoders 120 and the column decoders 130 to attempt to access the open bit and determine the location of the single bit fail. In certain embodiments, the memory controller 140 may store the location of the open bit.

At block 328, the memory controller 140 may determine the location of the word line that the defect is present on based upon the determination that the defect is the short bit fail. In some embodiments, the sensing component 125 may be coupled to the positive bias side of the memory array 102. The sensing component 125 may perform current sensing by passing current through the word line to determine if the bits in the word line have snapped or not. As such, when the short bit fail is occurring, all bits sharing a same positively biased line will show a snap (e.g. bits 306 or bits 308).

Figure 7:
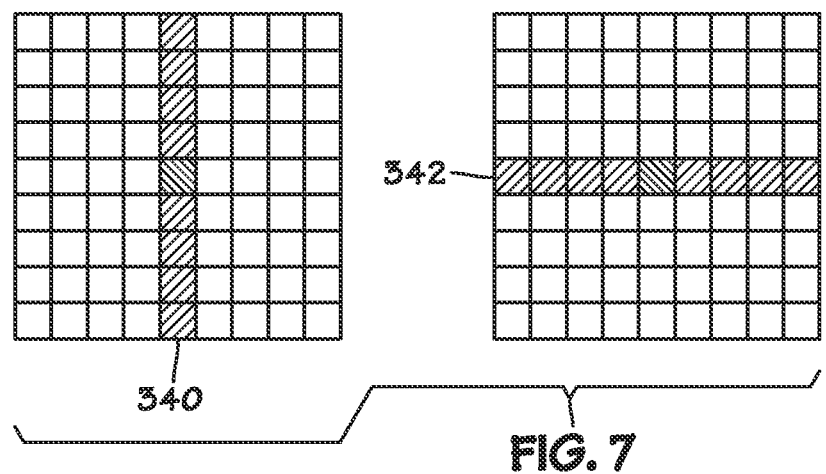
FIG. 7 is a diagram illustrating the detection of the single wordline and single bitline failure to determine the location of a failed bit of the memory portion of FIG. 2, in accordance with an embodiment.

With the foregoing in mind, FIG. 7 illustrates a graphical representation of the detection of the single wordline to determine the location of a failed bit of the memory portion of FIG. 2. The sensing component 125 may detect a single word line fail 340 by detecting an entire word line 110 as snapped. The sensing component 125 may transmit an address of the single word line fail 340 to the memory controller 140.

Returning to FIG. 6, at block 330, the memory controller 140 may determine that the defect is the short bit fail and determine the location of the word line that the defect is present on. As described earlier, in some embodiments, the sensing component 125 may be coupled to the positive bias side of the memory array 102. The memory array 102 can allow for sensing on both the word line and the bit line by reversing the polarity of the array and performing the sensing described at block 328. The sensing component 125 may reverse the polarity of sensing to determine if any bits on the bit line 115 has snapped. In certain embodiments, the sensing component 126 may additionally be coupled to the positive bias side of the memory array 102 and perform sensing in place of the sensing component 125. In addition to the embodiment describe above, FIG. 7 illustrates a graphical representation of the detection of the single bitline to determine the location of a failed bit of the memory portion of FIG. 2. The sensing component 125 may detect a single bit line fail 342 by detecting an entire bit line as snapped. The sensing component 125 may transmit an address of the single bit line fail 342 to the memory controller 140.

Returning again to FIG. 6, at block 332, the memory controller 140 may utilize the address information of the single word line 340 and bit line 342 fails determined by the sensing component 125 to determine the location of the short bit fail. The memory controller 140 may cross the address information of the single word line fail 340 and the bit line fail 342 to determine a location for the short bit fail, as illustrated in FIG. 7. The memory controller 140 may store the location of the short bit fail for future analysis.

As additionally illustrated in FIG. 6, at block 334, the memory controller 140 may perform a blown operation at the location of the short bit fail. The blown operation will cause the short bit fail to become the open bit fail. The blown operation will be further described below with respect to FIG. 8. The blown operation may include accessing and cycling a bit continuously until the bit defect converts from the short bit fail to the open bit fail.

Figure 8:
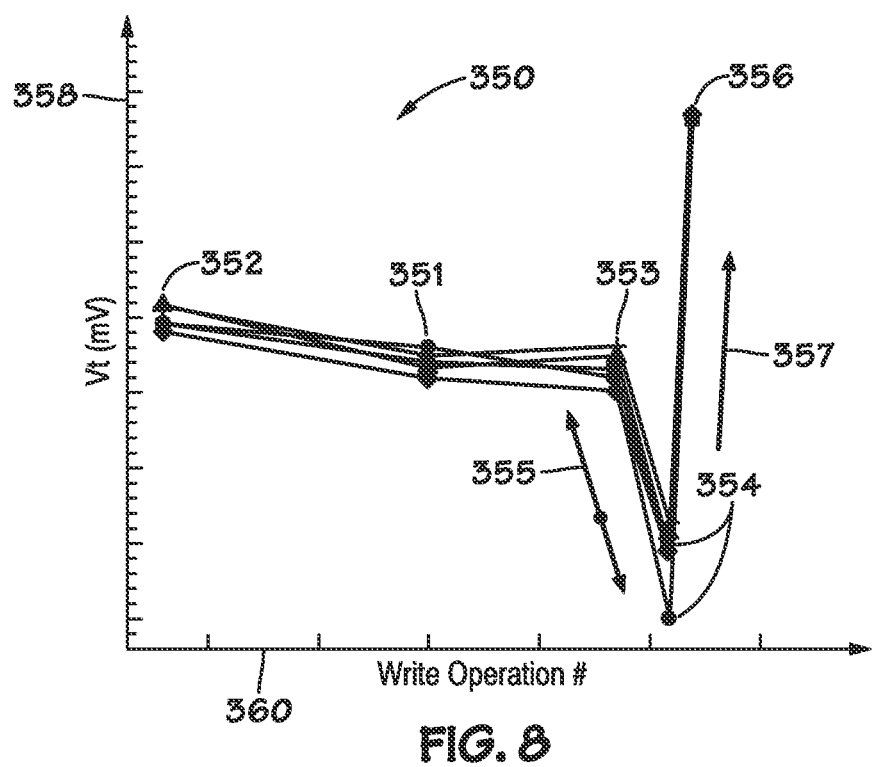
FIG. 8 is an example of a graph illustrating a result of the blown operation step of FIG. 6, in accordance with the present disclosure.

With the foregoing in mind, FIG. 8 depicts a graph 350 of the blown operation. The graph 350 includes a threshold voltage ($V_t$) axis 358 with units in mV increasing from the origin of the plot upwards, where the units of the threshold voltage ($V_t$) axis 358 may be between 4,500 mV and 8,000 mV. Additionally, the graph 350 includes a write operation cycle count axis 360 indicative of the number of times the bit is cycled and written, where the units of the write operation cycle count axis 360 may be between 1e+2 and 1e+7. As described above, the blown operation consists of cycling a selected defective bit until the short bit fail is blown into an open bit fail.

In normal operation, the $V_t$ 351 of the memory bits of the memory array 102 may be located around or at point 352. In certain embodiments, the $V_t$ 351 of the memory bits during normal operation may be anywhere between point 352 and the drop in $V_t$ 351 before point 353. When the short bit defect occurs, the $V_t$ 351 may be located at or around point 354. In certain embodiments, the $V_t$ 351 of the bit during the short bit defect may be anywhere between point 353 and point 354.

At point 352, the threshold voltage is at a normal level for the selected bit. This point designates normal operation for the bit. The bits are cycled every time a command to write to the cell is sent. As the bit is cycled repeatedly, it may experience a change in threshold voltage.

The bit may be cycled, for example, between ~1.1 million to ~1.7 million times and the $V_t$ drops significantly and will continue to drop until point 354. At the point 354, continuing to cycle the bit, for example, between 1 million and 1.5 million more times at point 354 will cause the $V_t$ of the bit to move (along 355) to the $V_t$(along 357) at point 356. This spike in threshold voltage indicates that the short bit has been blown into the open bit. This graph illustrates an ability of the memory array design to allow for the blown operation from a previously shorted bit.

In some embodiments, the time for completion of the blown operation may be altered by changing pulse width (e.g. the elapsed time between the rising and the falling edges of a single pulse) and current delivered to the short bit. This may have the effect of increasing the slope between the point 353 and the point 354 due to less cycles being required to complete the blown operation and further exemplify the decreased time for the blown operation to occur. The pulse width and the current may be controlled by the memory controller 140.

The detection and blown operations may be useful in for media management. In certain embodiments, the detection and blown operations may be applied to an operator's mobile device (e.g. a portable phone, tablet, laptop, etc.). In other embodiments, the detection and blown operations may be applied to a datacenter or any other suitable location that may include one or more stationary devices utilizing one or more of the memory devices 100.

However, implementing the detection and blown operations may result in media consistency degradation due to the overhead required to run the detection and blown operations. That is, the time requirements and the power requirements to run these operations may need to be considered for system-level implementation. With the foregoing in mind, FIG. 9 is a flowchart of a method 400 illustrating scheduling and testing the memory array of the memory device 100 in an electronic device. The testing of the memory array of the memory device 100 may include part of all of the method 320 of FIG. 6.

At block 402, the memory controller 140 may determine operating characteristics of the electronic device. The operating characteristics of the electronic device may include a period of time to test based upon when the electronic device is not being utilized, when the electronic device is connected to a charging circuit for longer than a threshold length of time, and/or current utilization of the electronic device. In some embodiments, the threshold length of time may be based upon a pre-determined value, a sleep schedule of the operator, a period of time where the electronic device usage is below a usage threshold, and/or any other suitable schedule.

The period of time to test may be associated the threshold length of time and occur during the threshold length of time. That is, the period of time to test will be less than or equal to the threshold length of time. In certain embodiments, the period of time to test may be pre-determined and stored within the memory controller 140. In other embodiments, the period of time to test may be dynamically changed based upon the determination process at block 402.

At block 404, the memory controller 140 may schedule testing. In other embodiments, a processor outside of the electronic device may perform scheduling of testing through the input/output 135. In certain embodiments, prior to testing, the memory controller 140 may determine if the electronic device is above the usage threshold and cancel the scheduled testing. This has the advantage of not interrupting normal operation and usage by the operator. In some embodiments, the electronic device may prompt the operator to perform testing if the electronic device is within use above the usage threshold during the scheduled period of time.

In some embodiments, the memory controller 140 may determine that the time of day and the day of the week is outside of the scheduled time period on the scheduled day of the week. The primary memory controller 140 may instruct the other devices to continue normal operation until the conditions for testing are met. In certain embodiments, the primary memory controller 140 may send commands to prepare for testing if the time of day is within a certain threshold of time from the scheduled time period on the scheduled day of the week. These commands may include allocating memory for testing, preparing sensing components, or any other necessary preparation step for testing.

In other embodiments, the memory controller 140 may determine that the time of day and the day of the week is within the scheduled time period on the scheduled day of the week. The primary memory controller 140 may instruct the other devices to prepare and conduct the scheduled test. In certain embodiments, the datacenter operations may pause to allow for the scheduled test to proceed and complete. In some embodiments, the scheduled test may occur in the background as a background process to not interfere with normal operation of the datacenter. That is, the scheduled test may only occupy a minimal amount of memory to ensure normal operation of the datacenter during the scheduled testing.

In certain embodiments, data collected during the scheduled test may be stored within the memory array 102. The data collected from the scheduled test may include defect data, such as short bit locations, open bit locations, affected word lines locations, affected bit lines locations, current measurements at defect locations, and memory array operational data, such as performance, efficiency, and efficacy, and any other data that is related to the memory array operation and defects.

At block 406, the memory controller 140 may determine if the electronic device operating characteristics allow for the scheduled test to proceed. In some embodiments, the operating characteristics that allow for testing may include when the current time is within the scheduled period of time to test, when the electronic device is connected to the charging circuit, and/or when the electronic device utilization is below the threshold. The memory controller 140 may determine current time and electronic device. In some embodiments, the memory controller 140 may access the electronic device's internal clock, a connection to the internet through the electronic device's WiFi or cellular connection, and/or an internal clock within the memory controller 140 to determine the current time. In certain embodiments, the memory controller 140 may verify the current time by cross-referencing any of the above clocks.

The electronic device usage may be determined by the memory controller 140. The memory controller 140 may access one or more processors of the electronic device and request the usage data. The usage data may be created by the one or more processors based upon any applications currently being run by the operator on the electronic device. Background processes of the electronic device may be factored into the usage threshold and ignored by the memory controller 140 when determining the electronic device usage. In certain embodiments, the memory controller 140 may request that the background processes are cancelled immediately or upon completion based upon the usage threshold.

The memory controller 140 may access the input/output 135 to determine if the electronic device is connected to the charging circuit. In other embodiments, the memory controller 140 may request battery level date from the one or more processors of the electronic device and determine if the electronic device is currently being charged.

At block 408, the memory controller 140 may determine that the current time is outside of the scheduled period of time to test, the electronic device is not connected to the charging circuit, and/or the electronic device utilization is above the set threshold. The memory controller 140 may continue normal operation until the conditions for the scheduled test are met. In some embodiments, the memory controller 140 may prompt the operator to connect the electronic device to the charging circuit to begin the scan when the current time is within the scheduled period of time to test. In other embodiments, the memory controller 140 may present a notification to the user to restrict usage of the electronic device and begin testing when the electronic device usage is below the usage threshold, connected to the charging circuit and outside of the scheduled period of time to test.

At block 410, the memory controller 140 may determine that the current time is within the scheduled period of time to test, the electronic device is connected to the charging circuit, and/or the electronic device utilization is below the threshold. In some embodiments, the memory controller 140 may present a notification to the user to restrict usage of the electronic device while the scheduled test completes. The memory controller 140 may present a notification to the operator when the scheduled test is completed. In certain embodiments, the operator may not be notified of any progress, stoppage, or completion of the scheduled test. That is, the method 400 may be carried out without the operator's knowledge. In certain embodiments, data collected during the scheduled test may be stored within the memory array 102. The data collected from the scheduled test may include defect data, such as short bit locations, open bit locations, affected word lines locations, affected bit lines locations, current measurements at defect locations, and memory array operational data, such as performance, efficiency, and efficacy, and any other data that is related to the memory array operation and defects.

As discussed above, the method 400 may be applied to the datacenter or any other suitable location that may include the one or more devices. In some embodiments, the memory controller 140 may schedule testing during a certain time period on a certain day of the week. The certain time period and certain day of the week may be predetermined and transmitted into the memory controller 140 through the input/output 135. In other embodiments, the memory controller 140 may dynamically schedule the testing by determining when the datacenter operation is below an acceptable threshold where no interruptions from the testing will occur. In certain embodiments, the memory controller 140 of a primary device in the one or more devices of the datacenter may be chosen and a primary memory controller 140 of the primary device will send commands to the memory controllers 140 of the other devices within the datacenter. The memory controller 140 may store the certain time period on the certain day of the week as a scheduled time period on a scheduled day of the week within the memory array 102.

By employing the techniques described in the present disclosure, the systems and the methods described herein may allow for reduction of the impact of short bit defects in memory arrays 140. The memory controller 140 may receive an indication of the defect in the memory array and determine if the defect is the short bit defect or the open bit defect. The memory controller 140 may determine the single word line failure and the single bit line failure to locate the short bit defect. Once the short bit defect is located, the memory controller 140 may send the command to perform the blown operation of the short bit defect to change the short bit defect into the open bit defect. The detection and blown operation may be applied to a single electronic device and/or a datacenter with one or more devices with one or more sets of memory arrays. The testing for the defects may be scheduled in advanced and dynamically changed to maintain limited interference with normal operation. The memory controller 140 may determine that the scheduled test will proceed if certain conditions are met.

While only certain features of the present disclosure have been illustrated and described herein, many modifications and changes will occur to those skilled in the art. It is, therefore, to be understood that the appended claims are intended to cover all such modifications and changes as fall within the true spirit of the embodiments described herein.

What is claimed is:

1. A memory device comprising:
   a memory array comprising a plurality of memory elements; and
   a memory controller coupled to the memory array, wherein when in operation the memory controller:
   receives an indication of a defect in the memory array;
   determines a first location of the defect when the defect is affecting only one memory element of the plurality of memory elements;
   determines a second location of the defect when the defect is affecting two or more memory elements of the plurality of memory elements; and
   performs a blown operation on a defective memory element at the second location when the defect is affecting the two or more memory elements of the plurality of memory elements.

2. The memory device of claim 1, wherein the memory controller when in operation determines that the defect comprises an open bit defect when the defect is affecting only the one memory element of the plurality of memory elements.

3. The memory device of claim 2, wherein the open bit defect corresponds to a threshold voltage of a second defective memory element of the plurality of memory elements at the first location being above a predetermined level.

4. The memory device of claim 1, wherein the memory controller when in operation determines that the defect comprises a short bit defect when the defect is affecting the two or more memory elements of the plurality of memory elements.

5. The memory device of claim 4, wherein the short bit defect corresponds to a threshold voltage of the defective memory element of the plurality of memory elements at the second location being below a predetermined level.

6. The memory device of claim 1, wherein the memory controller is communicatively coupled to one or more sensing components, wherein the one or more sensing components when in operation detect the defect in the memory array and transmit the indication of the defect to the memory controller.

7. The memory device of claim 6, wherein the one or more sensing components when in operation switch between a positive polarity and a negative polarity.

8. The memory device of claim 6, wherein the one or more sensing components when in operation detect the defect in the memory array at a predetermined time.

9. The memory device of claim 1, wherein the memory controller when in operation repeatedly cycles the defective memory element at the second location as part of the blown operation to alter a threshold voltage of the defective memory element.

10. The memory device of claim 9, wherein memory controller when in operation initiates writes to the defective memory element least 1.5 million times as repeatedly cycling the defective memory element.

11. A method, comprising:
    determining a location of a defective memory element of a plurality of memory elements;
    determining whether a fault of the defective memory element is one of a first type of fault or a second type of fault; and
    accessing the defective memory element a predetermined number of times when the fault of the memory element is determined to be the first type of fault.

12. The method of claim 11, comprising determining a threshold voltage of the defective memory element.

13. The method of claim 12, comprising determining the fault of the defective memory element is the second type of fault when the threshold voltage is above a predetermined level.

14. The method of claim 13, comprising determining the second type of fault is an open bit fault of the defective memory element.

15. The method of claim 12, comprising determining the fault of the defective memory element is the first type of fault when the threshold voltage is below a predetermined level.

16. The method of claim 15, comprising determining the first type of fault is a short bit fault of the defective memory element.

17. The method of claim 11, comprising writing to the defective memory element the predetermined number of times as accessing the defective memory element.

18. The method of claim 11, comprising scheduling the determining of the location of the defective memory element of the plurality of memory elements to occur at a predetermined time.

19. The method of claim 18, comprising altering the predetermined time to a second predetermined time to determine the location of the defective memory element of the plurality of memory elements based upon a received indication.

20. A device, comprising:
 a memory controller that when in operation:
  determines whether a fault of a defective memory element is one of a first type of fault or a second type of fault; and
  accesses the defective memory element a predetermined number of times when the fault of the defective memory element is determined to be the second type of fault.

21. The device of claim 20, wherein the memory controller when in operation determines that the fault is the first type of fault based upon a determination that a threshold voltage of the defective memory element is below a predetermined level.

22. The device of claim 20, wherein the memory controller when in operation initiates a number of write operations to the defective memory element equal to the predetermined number of times to access the defective memory element the predetermined number of times.

* * * * *